(12) United States Patent
Pei et al.

(10) Patent No.: US 12,094,693 B2
(45) Date of Patent: Sep. 17, 2024

(54) BOTTOM ELECTRODE ASSEMBLY, PLASMA PROCESSING APPARATUS, AND METHOD OF REPLACING FOCUS RING

(71) Applicant: ADVANCED MICRO-FABRICATION EQUIPMENT INC. CHINA, Shanghai (CN)

(72) Inventors: Jiangtao Pei, Shanghai (CN); Zengdi Lian, Shanghai (CN); Rason Zuo, Shanghai (CN); Dee Wu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 575 days.

(21) Appl. No.: 17/521,779

(22) Filed: Nov. 8, 2021

(65) Prior Publication Data
US 2022/0165551 A1    May 26, 2022

(30) Foreign Application Priority Data
Nov. 23, 2020  (CN) .......................... 202011321713.X

(51) Int. Cl.
*H01J 37/32* (2006.01)
*H01L 21/687* (2006.01)
(52) U.S. Cl.
CPC .. *H01J 37/32642* (2013.01); *H01J 37/32568* (2013.01); *H01J 37/32807* (2013.01);
(Continued)

(58) Field of Classification Search
CPC ............ H01J 37/32642; H01J 37/32568; H01J 37/32807; H01J 37/3244; H01J 2237/024; H01J 2237/049; H01J 37/32541; H01J 37/3288; H01J 37/321; H01J 37/32532; H01J 37/32715; H01J 37/32834; H01L 21/68735; H01L 21/68742; H01L 21/67069; H01L 21/6833; H01L 21/68757; B23Q 3/15; H02N 13/00
See application file for complete search history.

(56) References Cited

U.S. PATENT DOCUMENTS

| | | | |
|---|---|---|---|
| 2019/0363003 A1* | 11/2019 | Sarode Vishwanath | ..................... H01L 21/68735 |
| 2020/0098550 A1* | 3/2020 | Takahashi | ......... H01L 21/68735 |
| 2020/0335312 A1* | 10/2020 | Kopec | ................. H01L 21/6875 |

* cited by examiner

*Primary Examiner* — Renan Luque
(74) *Attorney, Agent, or Firm* — Womble Bond Dickinson (US) LLP; Joseph Bach, Esq.

(57) ABSTRACT

Disclosed are a bottom electrode assembly, a plasma processing apparatus, and a method of replacing a focus ring, wherein the bottom electrode assembly comprises: a base for supporting a wafer to be processed; a focus ring provided surrounding the outer periphery of the base; a cover ring disposed beneath the focus ring, a plurality of recesses being arranged along the circumferential direction of the cover ring; moving blocks provided in the recesses, an inner top corner of each moving block being provided with a step, the step being configured to support part of the focus ring; and a drive device connected to the moving blocks to activate the moving blocks to drive the focus ring to move up and down. With the bottom electrode assembly, replacement of the focus ring can be performed without opening the process chamber.

20 Claims, 5 Drawing Sheets

(52) U.S. Cl.
CPC .... *H01L 21/68735* (2013.01); *H01J 37/3244* (2013.01); *H01J 2237/024* (2013.01); *H01J 2237/049* (2013.01)

BOTTOM ELECTRODE ASSEMBLY, PLASMA PROCESSING APPARATUS, AND METHOD OF REPLACING FOCUS RING

RELATED APPLICATIONS

The present application claims priority to and the benefit of Chinese Patent Application No. 202011321713.X, filed on Nov. 23, 2020, and the disclosure of which is hereby incorporated by reference in its entirety.

FIELD

Embodiments of the present disclosure relate to semiconductors, and more particularly relate to a bottom electrode assembly, a plasma processing apparatus, and a method of replacing a focus ring.

BACKGROUND

Among various processes of manufacturing a semiconductor device, plasma processing is a critical process in manufacturing a to-be-processed wafer into a designed pattern. In typical plasma processing, process gases are RF (radio-frequency) excited to form plasmas. These process gases either pass through the electric field between an upper electrode and a bottom electrode (capacitive coupled); or a RF electromagnetic field is fed into the reaction chamber via an inductive coil to form plasma (inductive coupled). With the plasmas, the to-be-processed wafer surface is processed by physical bombardment and chemical reaction.

In conventional plasma processing apparatuses, a focus ring is generally provided surrounding the to-be-processed wafer. The focus ring is configured to change gas flow and electromagnetic field distribution in the edge area of the to-be-processed wafer, thereby enhancing etching performance of the to-be-processed wafer. Due to long-term exposure to a plasma etching environment, the focus ring is gradually corroded with elapse of etching time; therefore, the focus ring needs to be replaced when serving for a period. Conventional methods of focus ring replacement require manual opening of the process chamber of the plasma processing apparatus, which increases work intensity of maintenance staff and deteriorates operating performance of the plasma processing apparatus. To resolve this problem, a novel focus ring lifting and handling structure is desired, which enables replacement without opening the process chamber.

SUMMARY

Embodiments of the present disclosure provide a bottom electrode assembly, a plasma processing apparatus, and a method of replacing a focus ring, such that the focus ring can be replaced without opening a process chamber.

In one aspect, the present disclosure provides a bottom electrode assembly, comprising: a base for supporting a wafer to be processed; a focus ring provided surrounding the outer periphery of the base; a cover ring provided beneath the focus ring, a plurality of recesses being arranged along the circumferential direction of the cover ring; moving blocks provided in the recesses, an inner side of each moving block being provided with a step, the step being configured to support part of the focus ring; and a drive device connected to the moving blocks to activate the moving blocks to drive the focus ring to move up and down.

Optionally, material of the moving blocks comprises ceramic.

Optionally, each of the moving blocks comprises an extending portion protruding outward relative to an outer sidewall of the cover ring, and the drive device is connected to the extending portion.

Optionally, the drive device refers to a cylinder drive device or an electric drive device.

Optionally, in cases that the drive device refers to the cylinder drive device, the drive device comprises a cylinder and an actuating rod, the actuating rod being connected to the moving blocks.

Optionally, the bottom electrode assembly further comprises: a plasma confinement device provided beneath the cover ring, the actuating rod passing through the plasma confinement device; and a ground ring provided beneath the cover ring, the ground ring enclosing the base and being connected to the cylinder.

Optionally, the number of the recesses is 3 or above.

Optionally, the bottom electrode assembly further comprises: a supporting ring, wherein the supporting ring includes a ring portion and a plurality of spokes arranged along the radial direction of the ring portion, the spokes being provided beneath the moving blocks, the diameter of the ring portion being greater than that of the cover ring; the drive device is connected with the supporting ring to activate the supporting ring to move, further driving the moving blocks and the focus ring to move up and down.

Optionally, the supporting ring and the moving blocks are detachably connected.

Optionally, the supporting ring and the moving blocks are in screwed connection.

Optionally, material of the supporting ring includes ceramic.

Optionally, the supporting ring has a ring-shaped structure, and the supporting ring is positioned beneath the moving blocks.

Optionally, the bottom electrode assembly further comprises: a robot arm that is configured to remove the focus ring or to dispose the focus ring to the outer periphery of the base when the focus ring is lifted by the drive device.

Optionally, the step is disposed at an inner top corner of the moving block.

Correspondingly, the present disclosure further provides a plasma processing apparatus, comprising: a process chamber; the bottom electrode assembly disposed in the process chamber.

Optionally, the plasma processing apparatus further comprises: a showerhead plate disposed on the top of the process chamber, the showerhead plate being arranged opposite the bottom electrode, configured to deliver process gases into the process chamber.

Optionally, the plasma processing apparatus further comprises: a dielectric window disposed on the top of the process chamber; an inductive coil disposed on the dielectric window; and a gas delivery device configured to deliver process gases into the process chamber.

Optionally, the plasma processing apparatus further comprises: a vacuum pump configured to vacuumize the inside of the process chamber.

Correspondingly, the present disclosure further provides a method of replacing a focus ring, comprising: providing the bottom electrode assembly described above; activating, by the drive device, the moving blocks to move upward to drive the focus ring to move upward; removing, by the robot arm, the focus ring after the focus ring is lifted.

Optionally, the method further comprises: providing a new focus ring; positioning the new focus ring onto the steps of the moving blocks; after the new focus ring is positioned on the steps of the moving blocks, activating, by the drive device, the moving blocks and the focus ring to move downward till the to-be-processed wafer is positioned on the surface of the base.

Compared with the prior art, the technical solutions in the embodiments of the present disclosure offer the following beneficial effects:

In the bottom electrode assembly provided by the technical solutions of the present disclosure, when the focus ring exposed in the plasma environment is etched to such an extent of not satisfying process requirements, the drive device activates the moving blocks to move upwards; during the course of upward moving, the moving blocks drive the focus ring to move upward, and then the robot arm is used to remove the focus ring that does not satisfy process requirements. And then, the robot arm transfers a new focus ring onto the step provided with the moving blocks, and under activation of the drive device, the new focus ring and the moving blocks are moved downward till the process state to be ready for the next etching process. As such, the focus ring is replaced without a need of opening the process chamber, not contaminating the vacuum environment in the process chamber; then, after replacement of the focus ring, the next process may be directly performed without further adjusting the vacuum level in the process chamber, thereby facilitating enhancement of operating performance of the plasma processing apparatus.

DETAILED DESCRIPTION

Figure 1:
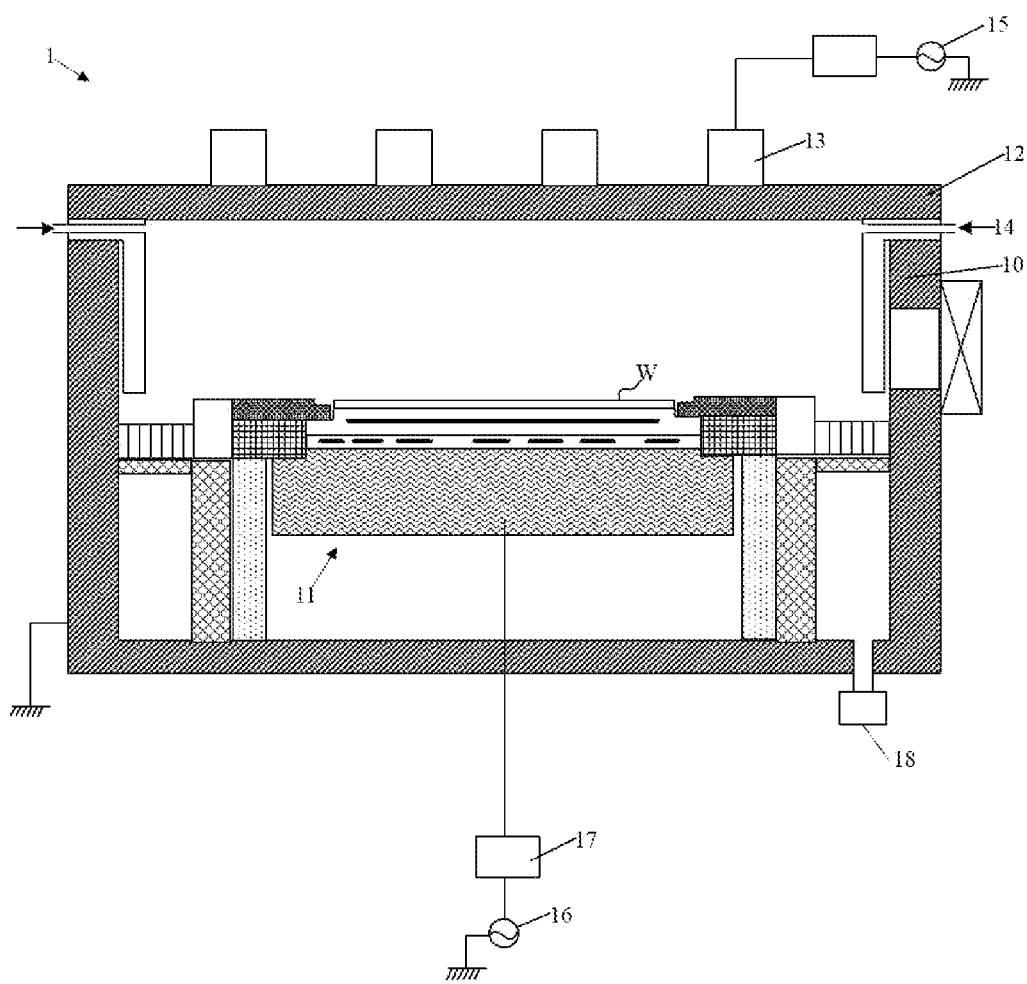
FIG. 1 is a structural schematic diagram of a plasma processing apparatus according to the present disclosure.

As stated in the Background, focus ring replacement needs manual opening of the process chamber. To this end, the present disclosure focuses on providing a bottom electrode assembly and a plasma processing apparatus, so as to realize focus ring replacement without opening the process chamber, which will be described in detail below:

FIG. 1 is a structural schematic diagram of a plasma processing apparatus according to the present disclosure.

Please refer to FIG. 1. A plasma processing apparatus 1 comprises: a process chamber 10; a bottom electrode assembly 11 disposed at the bottom of the process chamber 10 and configured to support a wafer W to be processed; a dielectric window 12 disposed on the top of the processing chamber 10; and an inductive coil 13 disposed on the surface of the dielectric window 12.

In this embodiment, the plasma processing apparatus 1 refers to an inductive coupled plasma etching apparatus (ICP). The plasma processing apparatus 1 further comprises: a gas delivery device 14 configured to deliver process gases into the process chamber 10; a RF power source 15 connected with the inductive coil 13; a bias RF power source 16 which applies a bias RF voltage to the bottom electrode assembly 11 via a RF match network 17 and is configured to control bombardment direction of charged particles in the plasma; and a vacuum pump 18 which is further provided beneath the process chamber 10 and configured to discharge reaction byproducts out of the process chamber 10 to thereby maintain vacuum environment in the process chamber 10.

In an embodiment, the gas delivery device 14 is provided at an end of the sidewall of the process chamber 10 proximal to the dielectric window 12. In an alternative embodiment, the gas delivery device 14 may be provided in the central area of the dielectric window 12, wherein the gas delivery device 14 is configured to inject process gases into the process chamber 10, and the RF power of the RF power source 15 activates the inductive coil 13 to generate a strong high frequency alternating magnetic field, causing the low-pressure process gases in the process chamber 100 to be ionized to generate plasma. The plasma includes large quantities of active particles such as electrons, ions, excited atoms, molecules, and free radicals. The active particles may undergo a plurality of physical and chemical reactions on the surface of the wafer to be processed, causing changes to the wafer surface topography, thereby completing an etching process.

In this embodiment, the plasma processing apparatus refers to a capacitive coupled plasma etching apparatus (CCP). The plasma processing apparatus further comprises: a mounting base disposed on the top of the process chamber, and a showerhead plate disposed on the mounting base, the showerhead plate being arranged opposite the electrostatic chuck; a gas supply device connected with the showerhead plate, the gas supply device being configured to deliver process gases into the process chamber; an RF power source connected to the showerhead plate or the base, wherein the corresponding showerhead plate or the base are grounded, and an RF signal generated by the RF power source enables the process gases to be converted into plasma by the capacitance formed between the showerhead plate and the base, wherein the plasma is applied to perform plasma processing to the to-be-processed wafer.

Hereinafter, the bottom electrode assembly 11 will be explained in detail.

Figure 2:
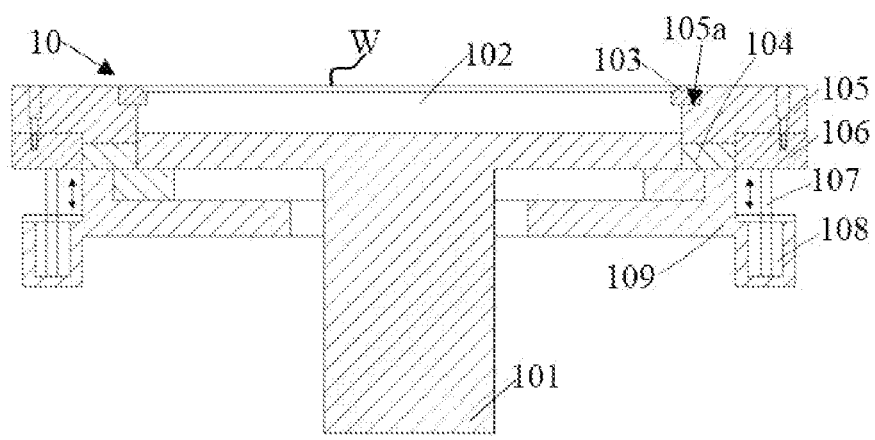
FIG. 2 is a structural schematic diagram of a bottom electrode assembly of the present disclosure.
Figure 3:
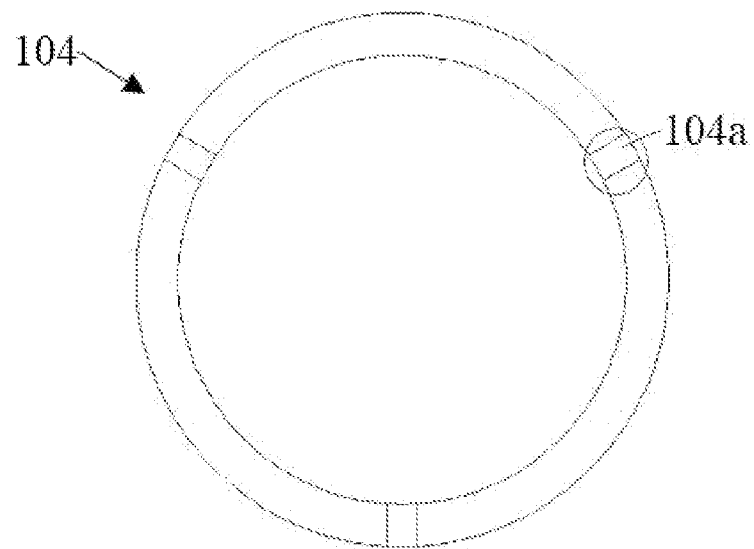
FIG. 3 is a top view of a cover ring according to the present disclosure.
Figure 4:
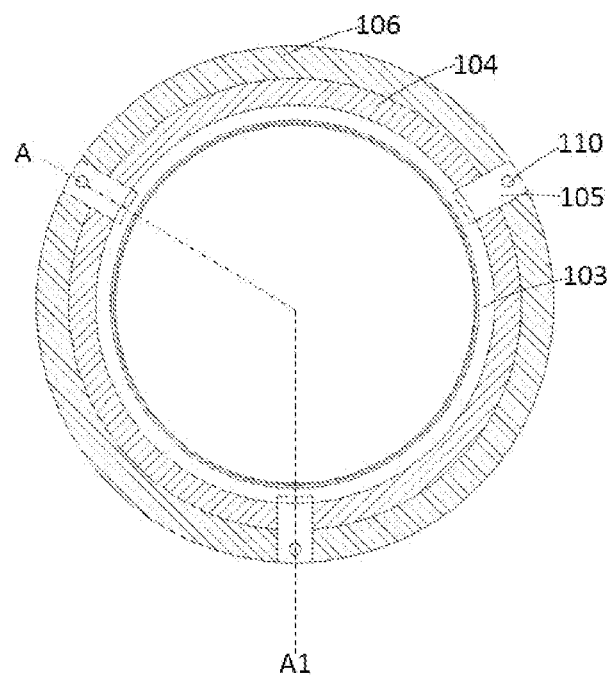
FIG. 4 is a top view of the bottom electrode assembly of FIG. 2 according to the present disclosure.

FIG. 2 is a structural schematic diagram of a bottom electrode assembly of the present disclosure; FIG. 3 is a top view of a cover ring according to the present disclosure; FIG. 4 is a top view of the bottom electrode assembly of FIG. 2 according to the present disclosure; and FIG. 2 is sectional view of FIG. 4 along line A-A1.

Please refer to FIG. 2. A bottom electrode assembly 11 comprises: a base 101 configured to support a wafer W to be processed; a focus ring 103 surrounding the outer periphery of the base 101; a cover ring 104 surrounding the focus ring 103 and having its top surface exposed to the plasma above, wherein the bottom surface of the cover ring 104 is lower than the bottom surface of the focus ring 103, and a plurality of recesses are provided along the circumferential direction of the cover ring 104; moving blocks 105 provided in the recesses, the inner side of each moving block 105 is provided with a step, the step being configured to support part of the focus ring 103, wherein the upper surfaces of the moving blocks 105 may be in flush with the upper surface of the cover ring 104 so as to improve uniformity of plasma processing; a supporting ring 106 disposed beneath the moving blocks 105; and a drive device connected with the supporting ring 106, the drive device being configured to actuate the supporting ring 106 to drive the moving blocks 105 and the focus ring 103 to move up and down.

The bottom electrode assembly 10 further comprises: an electrostatic chuck 102 disposed on the base 101 and configured to electrostatically attract the wafer W to be processed. When performing surface processing to the wafer W to be processed, in order to ameliorate non-uniformity of plasma distribution in the edge area of the wafer W to be processed, a focus ring 103 is provided surrounding the wafer W to be processed, which is equivalent to outwardly expanding the radius of the wafer W to be processed, such that plasma with the same conditions as those above the wafer W to be processed is generated above the focus ring 103, which effectively extends the plasma distribution edge above the wafer W to be processed till the outer sidewall of the focus ring 103, increases the distribution range of the plasma, and expands the density distribution curve of the plasma on the surface of the wafer W to be processed, such that the density distribution of the plasma on the to-be-processed wafer W tends to be flat; in this way, the plasma distribution density of the to-be-processed wafer W becomes more uniform, thereby ensuring uniformity of the etching process in the edge area and the center area.

Material of the focus 103 includes silicon or silicon carbide, and material of the wafer W to be processed includes silicon. Therefore, during the course of performing plasma processing to the surface of the to-be-processed wafer W, it is also easy to etch the surface of the focus ring 103. Namely, during the course of performing plasma processing to the surface of the to-be-processed wafer W, the height of the focus ring 103 is increasingly reduced; when the height of the focus ring 103 is reduced to a certain extent, it is hard to satisfy the process requirements; in this case, it is needed to be replaced with a new focus ring 103.

In this embodiment, the drive device refers to a cylinder drive device, specifically comprising: a cylinder 108 and an actuating rod 107. In an alternative embodiment, the drive device is an electrical actuator.

In this embodiment, the moving blocks 105 comprises an extending portion protruding outward relative to the outer sidewall of the cover ring 104, and the drive device is connected to the extending portion of moving blocks 105.

The cover ring 104 is configured to protect the parts beneath the cover ring 104 from being corroded by the plasma. Material of the cover ring 104 includes: silicon oxide. A plurality of recesses 104a are provided along the circumferential direction of the cover ring 104 (see FIG. 3), wherein the recesses 104a are configured to accommodate the moving blocks 105. Material of the moving blocks 105 includes ceramic, such that the moving blocks 105 can resist plasma corrosion when being exposed to the plasma environment. In an alternative embodiment, a step 105a is provided at the inner top corner of each of the moving blocks 105. In an alternative embodiment, the step may also be provided at another position of the inner side of the moving block. The step is configured for supporting part of the focus ring 103; in this way, when the supporting ring 106 is driven to move up and down by the drive device (cylinder 108 and actuating rod 107), the focus ring 103 can be driven to move up and down.

The supporting ring 106 is detachably connected with the moving blocks 105 via connectors 110 (see FIG. 4). Specifically, in an embodiment, the supporting ring 106 and the moving blocks 105 may be securely connected via screws.

The plasma processing apparatus further comprises: a plasma confinement device provided beneath the cover ring 104, the actuating rod 107 passing through the plasma confinement device; and a ground ring 109 provided beneath the cover ring 104, the ground ring enclosing the base 101 and being connected to the cylinder 108.

Figure 5:
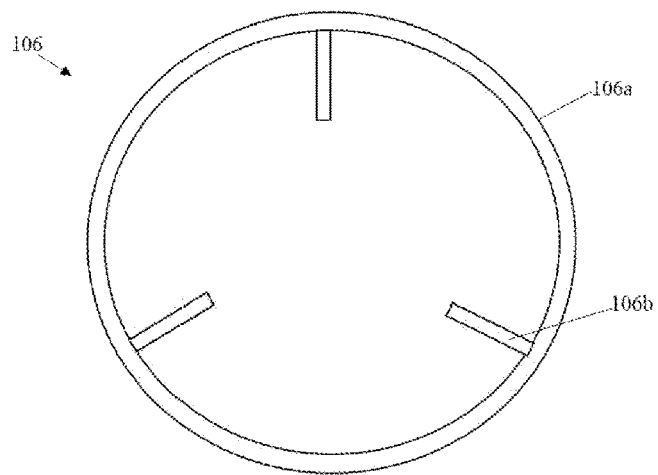
FIG. 5 is a top view of a supporting ring of FIG. 2.

Please refer to FIG. 5, the supporting ring 106 comprises a ring portion 106a and a plurality of spokes 106b radially arranged along the ring portion 106a. Here, the number of the spokes 106 is schematically illustrated to be 3. In actuality, the number of the spokes 106b is not limited.

The spokes 106b are provided surrounding the cover ring 104, and the spokes 106b are positioned beneath the moving blocks 105. In this way, when the drive device drives the supporting ring 106 to move upward, the spokes 106 can support the moving blocks 105 due to the large contact area between the spokes 106b and the moving blocks 105. As the lifting force is exerted on an end point portion rather than the center of the moving block 105, in order to prevent the moving block 105 from deflection caused by the toque imposed by the lifting force, the contact area between the spokes 106b and the moving blocks 105 is enlarged, such that the moving block receives a vertical upward force, avoiding scratching or friction with the wall of the recess of the cover ring 104.

Moreover, with such a configuration of the supporting ring 106, the ring portion 106a has a relatively small width, reducing occlusion of the ring portion 106a with respect to the plasma confinement device below, facilitating the vacuum pump 18 to extract the gases out of the process chamber 10. Additionally, owing to the relatively small width of the ring portion 106a, the cover ring 106 has a light weight, facilitating lifting the focus ring 103.

When the focus ring 103 is lifted to a certain height, since the moving blocks 105 are positioned above the supporting ring 106 and the adjacent moving blocks 105 are mutually separated, the gap between the adjacent moving blocks 105 allows the robot arm to access and remove the focus ring 103 that does not satisfy process requirements so as to replace with a new focus ring 103. Process chamber will not be opened during the replacement process, such that the vacuum environment in the process chamber will not be contaminated; then, after the new focus ring 103 is loaded, the next process may be directly performed without adjusting the vacuum level in the process chamber, thereby facilitating enhancement of the operating performance of the plasma processing apparatus.

Figure 6:
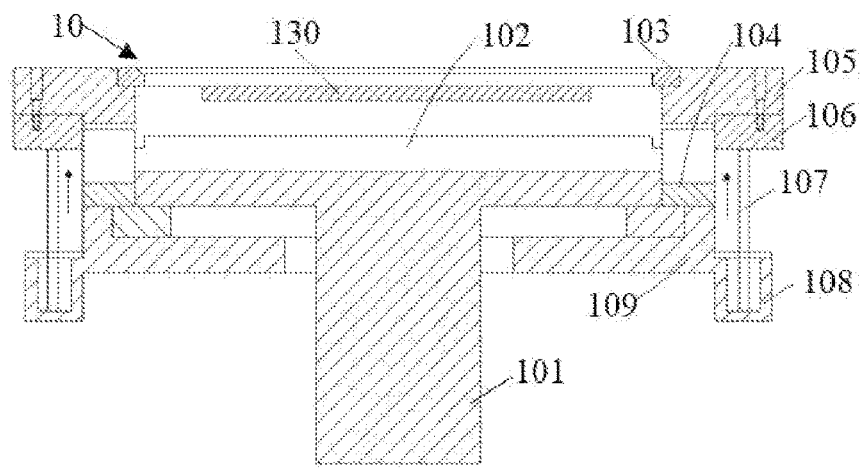
FIG. 6 is a structural schematic diagram when the focus ring of the bottom electrode assembly of FIG. 2 is lifted.

FIG. 6 is a structural schematic diagram when the focus ring in the bottom electrode assembly of FIG. 2 is lifted;

The cylinder 108 activates the actuating rod 107, the actuating rod 107 lifts the supporting ring 106, the supporting ring 106 drives the moving blocks 105 and the focus ring 103 to move upward; after the focus ring 103, the moving blocks 105, and the supporting ring 106 move to a preset height, the robot arm 103 crosses the gap between the adjacent moving blocks 105 till being disposed beneath the focus ring 103 to thereby remove the focus ring 103 that does not satisfy process requirements. Then, the robot arm 130 places a new focus ring 103 on the steps of the moving blocks 105, and the cylinder 108 drives the actuating rod 107 to move downward, such that the focus ring 103 surrounds the outer periphery of the to-be-processed wafer W, ready for the next process, thereby providing a relatively good uniformity in etching the surface of the to-be-processed wafer W.

Figure 7:
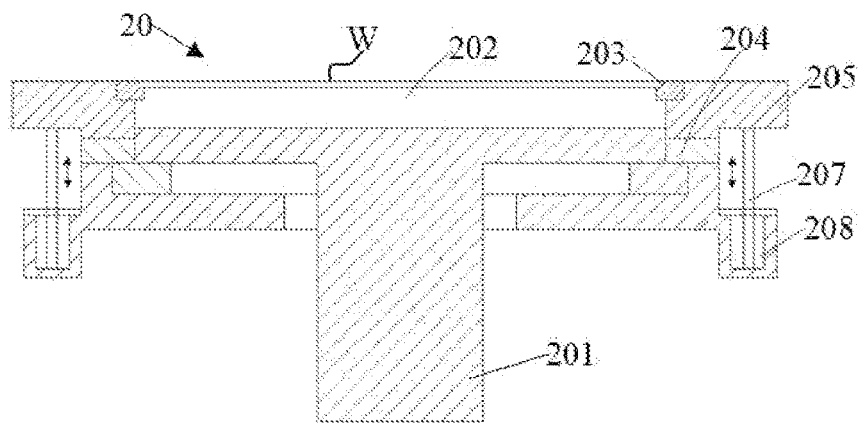
FIG. 7 is a structural schematic diagram of another bottom electrode assembly of the present disclosure.
Figure 8:
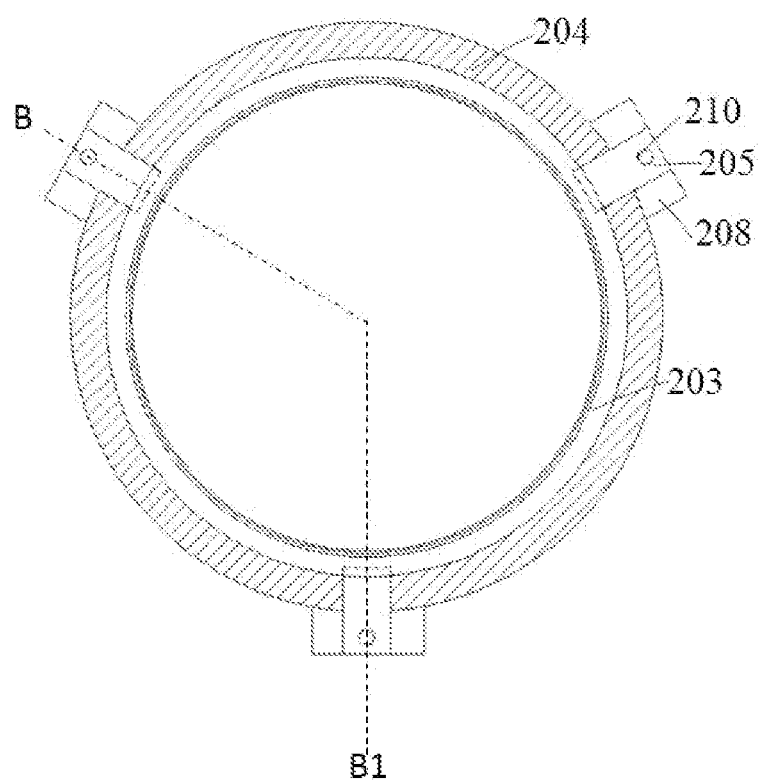
FIG. 8 is a top view of the bottom electrode assembly of FIG. 7.

FIG. 7 is a structural schematic diagram of another bottom electrode assembly of the present disclosure; FIG. 8 is a top view of the bottom electrode assembly of FIG. 7; and FIG. 7 is sectional view of FIG. 8 along line B-Bl.

Please refer to FIG. 7 and FIG. 8. The bottom electrode assembly 20 comprises: a base 201; an electrostatic chuck disposed on the base 201, the electrostatic chuck 202 being configured to hold the wafer W to be processed; a focus ring 203 provided surrounding the outer periphery of the base 201; a cover ring 204 provided beneath the focus ring 203, a plurality of recesses being arranged along the circumferential direction of the cover ring 204; moving blocks 205 provided in the recesses, a step being provided at an inner top corner of each moving block, the step being configured to support part of the focus ring 203; a drive device connected to the moving blocks 205 to drive the moving blocks to move the focus ring 203 up and down.

In this embodiment, the drive device refers to a cylinder drive device, specifically comprising: a cylinder 208 and an actuating rod 207. In other embodiments, the drive device is an electric driving device.

In this embodiment, the cylinder 208 activates the actuating rod 207 to lift the moving blocks 205, and the moving blocks 205 drive the focus ring 203 to move upward; because a gap is present between adjacent moving blocks 205, the robot arm can pass through the gap to remove the focus ring 203 to replace the focus ring 203 not satisfying the process requirements. The process chamber will not be opened during the replacement process, such that the vacuum environment in the process chamber will not be contaminated; then, after the new focus ring 103 is loaded, the next process may be directly performed without adjusting the vacuum level in the process chamber, thereby facilitating enhancement of the operating performance of the plasma processing apparatus.

Figure 9:
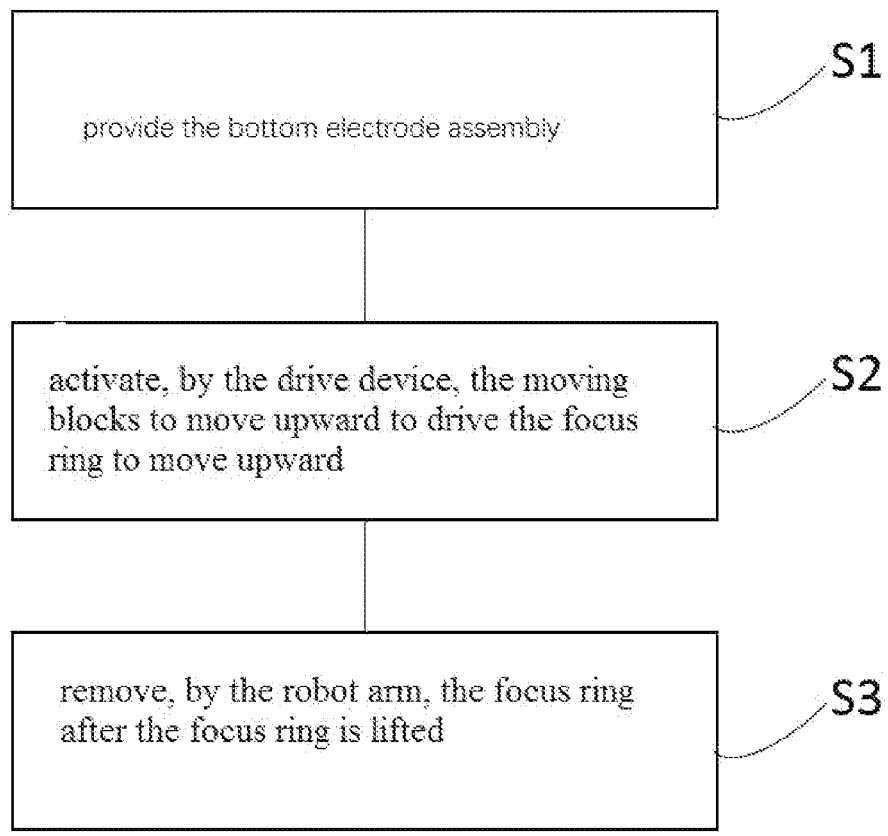
FIG. 9 is a flow diagram of a method of replacing a focus ring according to the present disclosure.

Correspondingly, the present disclosure provides a method of replacing a focus ring, specifically referring to FIG. 9.

Please refer to FIG. 9. The method comprises: step S1: providing the bottom electrode assembly described above; step S2: driving, by the drive device, the moving blocks to move upward to bring the focus ring to move upward; step S3: removing, by the robot arm, the focus ring after the focus ring is lifted.

When the focus ring that does not satisfy process requirements is removed by the method illustrated in FIG. 9, chamber lid of the process chamber will not be opened, such that the vacuum environment in the process chamber is not contaminated, which facilitates enhancement of the operating efficiency.

The method of replacing a focus ring further comprises: providing a new focus ring; disposing the new focus ring onto the steps of the moving blocks; after the new focus ring is disposed on the steps of the moving blocks, driving, by the drive device, the moving blocks and the focus ring to move downward till the focus ring is positioned surrounding the outer periphery of the base, thereby completing replacement of the focus ring.

Although the present disclosure has been described above, the present disclosure is not limited thereto. Any person skilled in the art may make various changes and modifications without departing from the spirit and scope of the present disclosure; therefore, the protection scope of the present disclosure should accord with the scope defined by the appended claims.

What is claimed is:

1. A bottom electrode assembly for a plasma processing apparatus, comprising:
a base for supporting a wafer to be processed;
a focus ring surrounding the outer periphery of the base;
a cover ring surrounding the outer periphery of the focus ring, a plurality of recesses being arranged along the circumferential direction of the cover ring;
moving blocks provided in the recesses, an inner side of each moving block being provided with a step, the step being configured to support part of the focus ring; and
a drive device connected to the moving blocks to activate the moving blocks to drive the focus ring to move up and down.

2. The bottom electrode assembly according to claim 1, wherein material of the moving blocks comprises ceramic.

3. The bottom electrode assembly according to claim 1, wherein each of the moving blocks comprises an extending portion protruding outward relative to an outer sidewall of the cover ring, and the drive device is connected to the extending portion.

4. The bottom electrode assembly according to claim 1, wherein the drive device is a cylinder drive device or an electric drive device.

5. The bottom electrode assembly according to claim 4, wherein in cases that the drive device is the cylinder drive device, the drive device comprises a cylinder and an actuating rod, the actuating rod being connected to the moving blocks.

6. The bottom electrode assembly according to claim 5, further comprising: a plasma confinement device provided beneath the cover ring, the actuating rod passing through the plasma confinement device; and a ground ring provided beneath the cover ring, the ground ring enclosing the base and being connected to the cylinder.

7. The bottom electrode assembly according to claim 1, wherein the number of the recesses is 3 or above.

8. The bottom electrode assembly according to claim 1, further comprising: a supporting ring, wherein the supporting ring includes a ring portion and a plurality of spokes arranged facing the center of the ring portion, the spokes being provided beneath the moving blocks, the diameter of the ring portion being greater than that of the cover ring; and the drive device is connected with the supporting ring to activate the supporting ring to move up and down, further driving the moving blocks and the focus ring to move up and down.

9. The bottom electrode assembly according to claim 8, wherein the supporting ring and the moving blocks are detachably connected.

10. The bottom electrode assembly according to claim 9, wherein the supporting ring and the moving blocks are in screwed connection.

11. The bottom electrode assembly according to claim 8, wherein material of the supporting ring comprises ceramic.

12. The bottom electrode assembly according to claim 8, wherein the supporting ring has a ring-shaped structure, and the supporting ring is positioned beneath the moving blocks.

13. The bottom electrode assembly according to claim 1, further comprising: a robot arm that is configured to remove the focus ring or to dispose the focus ring to the outer periphery of the base when the focus ring is lifted by the drive device.

14. The bottom electrode assembly according to claim 1, wherein the step is disposed at an inner top corner of the moving blocks.

15. A plasma processing apparatus, comprising:
a process chamber;
the bottom electrode assembly according to claim 1, which is disposed in the process chamber.

16. The plasma processing apparatus according to claim 15, further comprising: a showerhead plate disposed on the top of the process chamber, the showerhead plate being arranged opposite the bottom electrode assembly, configured to deliver process gases into the process chamber.

17. The plasma processing apparatus according to claim 15, further comprising: a dielectric window disposed on the top of the process chamber; an inductive coil disposed on the dielectric window; and a gas delivery device configured to deliver process gases into the process chamber.

18. The plasma processing apparatus according to claim 16, further comprising: a vacuum pump configured to vacuumize the inside of the process chamber.

19. A method of replacing a focus ring, comprising:
providing the bottom electrode assembly according to claim 13;
activating, by the drive device, the moving blocks to move upward to drive the focus ring to move upward; and
removing, by the robot arm, the focus ring after the focus ring is lifted.

20. The method of replacing a focus ring according to claim 19, further comprises:
providing a new focus ring;
disposing the new focus ring onto the steps of the moving blocks;
after the new focus ring is disposed on the steps of the moving blocks, activating, by the drive device, the moving blocks and the focus ring to move downward till the focus ring is positioned at the outer periphery of the base.

* * * * *